United States Patent
Patel et al.

(10) Patent No.: US 7,040,538 B2
(45) Date of Patent: May 9, 2006

(54) BAR CODE READER INCLUDING LINEAR SENSOR ARRAY AND HYBRID CAMERA AND BAR CODE READER

(75) Inventors: Mehul Patel, Fort Salonga, NY (US); Thomas D. Bianculli, Manorville, NY (US); Bradley S. Carlson, Northport, NY (US); David Tsi Shi, Stony Brook, NY (US); Edmond L. Fratianni, Port Jefferson, NY (US); Eldho Kuriakose, Floral Park, NY (US); Jerry Chiocchio, Miller Place, NY (US); Walter Preuss, Glen Head, NY (US); Daniel C. Curry, Deer Park, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 10/191,970

(22) Filed: Jul. 8, 2002

(65) Prior Publication Data

US 2003/0080189 A1    May 1, 2003

Related U.S. Application Data

(63) Continuation-in-part of application No. 10/118,562, filed on Apr. 9, 2002.

(60) Provisional application No. 60/353,808, filed on Oct. 26, 2001.

(51) Int. Cl.
*G06K 7/14* (2006.01)

(52) U.S. Cl. .................. 235/454; 235/462.11

(58) Field of Classification Search ............. 235/454, 235/461, 462.01, 462.09, 462.1, 462.11, 462.41
See application file for complete search history.

(56) References Cited

U.S. PATENT DOCUMENTS

| 4,135,149 A |   | 1/1979 | Takahashi et al. ...... 340/147 R |
| 4,154,985 A |   | 5/1979 | Munter ................... 179/15 BV |
| 4,467,325 A | * | 8/1984 | Lustig ........................ 345/207 |
| 4,719,564 A |   | 1/1988 | Hara ........................... 364/200 |
| 4,897,866 A |   | 1/1990 | Majmudar ................... 379/94 |
| 5,029,183 A |   | 7/1991 | Tymes ............................. 375/1 |

(Continued)

FOREIGN PATENT DOCUMENTS

EP    0 782 297 A2    7/1997

(Continued)

OTHER PUBLICATIONS

D.R. Dewar, "Data Packer", *IBM Technical Disclosure Bulletin*, Jun. 1982, vol. 25, No. 1, pp. 265-268.

(Continued)

*Primary Examiner*—Daniel Stcyr
(74) *Attorney, Agent, or Firm*—Kirschstein, et al.

(57) ABSTRACT

A semiconductor detector device for detecting optical code symbols includes no more than 512 pixels. Each of the pixels has an aspect ratio that is greater than 2 to 1 with a short dimension not greater than 8 microns. In a bar code reader, a sensor for detecting the field of view of the reader includes a single semiconductor device having a collection of surfaces configured as a set of no less than 256 and no more than 512 pixels. Each of the pixels has an aspect ratio that is greater than 2 to 1, with a short dimension not less than 2 microns and not greater than 8 microns.

6 Claims, 10 Drawing Sheets

U.S. PATENT DOCUMENTS

| | | | |
|---|---|---|---|
| 5,119,479 A | 6/1992 | Arai et al. .................. 395/275 |
| 5,134,708 A | 7/1992 | Marui et al. ............... 455/33.2 |
| 5,170,252 A | 12/1992 | Gear et al. .................. 358/181 |
| 5,199,062 A | 3/1993 | Von Meister et al. ......... 379/67 |
| 5,210,398 A | 5/1993 | Metlitsky .................... 235/462 |
| 5,233,686 A | 8/1993 | Rickenbach et al. ........ 395/158 |
| 5,274,841 A | 12/1993 | Natarajan et al. ........... 455/33.4 |
| 5,280,498 A | 1/1994 | Tymes et al. .................. 375/1 |
| 5,280,621 A | 1/1994 | Barnes et al. ............... 395/800 |
| 5,317,630 A | 5/1994 | Feinberg et al. .............. 379/94 |
| 5,343,031 A * | 8/1994 | Yoshida ...................... 235/494 |
| 5,379,374 A | 1/1995 | Ishizaki et al. ............. 395/155 |
| 5,392,331 A | 2/1995 | Patsiokas et al. ............. 379/63 |
| 5,442,246 A | 8/1995 | Azegami et al. .............. 326/38 |
| 5,442,805 A | 8/1995 | Sagers et al. .............. 455/33.1 |
| 5,467,164 A | 11/1995 | Wells et al. .................. 355/23 |
| 5,525,788 A | 6/1996 | Bridgelall et al. .......... 235/462 |
| 5,528,621 A | 6/1996 | Heiman et al. ............. 375/200 |
| 5,530,498 A | 6/1996 | Miyazaki et al. ............. 354/21 |
| 5,548,359 A | 8/1996 | Wakabayashi ............... 354/21 |
| 5,581,707 A | 12/1996 | Kuecken ................ 395/200.13 |
| 5,602,391 A * | 2/1997 | Pines et al. .................. 250/332 |
| 5,604,516 A | 2/1997 | Herrod et al. ............... 345/168 |
| 5,634,058 A | 5/1997 | Allen et al. ................. 395/712 |
| 5,635,940 A | 6/1997 | Hickman et al. ........... 342/389 |
| 5,640,001 A | 6/1997 | Danielson et al. .......... 235/472 |
| 5,652,753 A | 7/1997 | Kopp et al. .................. 370/489 |
| 5,652,782 A | 7/1997 | Hughes-Hartogs ........... 379/27 |
| 5,668,803 A | 9/1997 | Tymes et al. ................ 370/312 |
| 5,675,139 A | 10/1997 | Fama ........................ 235/472 |
| 5,682,534 A | 10/1997 | Kapoor et al. ............... 395/684 |
| 5,694,580 A | 12/1997 | Narita et al. ................. 395/700 |
| 5,699,275 A | 12/1997 | Beasley et al. .......... 364/514 R |
| 5,703,349 A | 12/1997 | Meyerson et al. ........... 235/472 |
| 5,710,417 A * | 1/1998 | Joseph et al. .......... 235/462.09 |
| 5,732,349 A | 3/1998 | Sanpei et al. ................ 455/435 |
| 5,740,455 A | 4/1998 | Pavley et al. ................ 395/777 |
| 5,744,849 A * | 4/1998 | Sugawa ...................... 257/438 |
| 5,748,881 A | 5/1998 | Lewis et al. ........... 395/184.01 |
| 5,748,974 A | 5/1998 | Johnson ...................... 395/759 |
| 5,751,962 A | 5/1998 | Fanshier et al. ....... 395/200.53 |
| 5,757,021 A | 5/1998 | Dewaele ...................... 250/581 |
| 5,763,864 A * | 6/1998 | O'Hagan et al. ...... 235/462.07 |
| 5,764,992 A | 6/1998 | Kullick ...................... 395/712 |
| 5,770,841 A * | 6/1998 | Moed et al. ................. 235/375 |
| 5,777,580 A | 7/1998 | Janky ......................... 342/457 |
| 5,777,590 A | 7/1998 | Saxena et al. ................. 345/89 |
| 5,778,377 A | 7/1998 | Marlin et al. ............... 707/103 |
| 5,778,380 A | 7/1998 | Siefert ........................ 707/103 |
| 5,784,544 A | 7/1998 | Stevens ...................... 395/112 |
| 5,786,582 A * | 7/1998 | Roustaei ................ 235/462.01 |
| 5,787,288 A | 7/1998 | Nagata ........................ 395/712 |
| 5,801,696 A | 9/1998 | Roberts ...................... 345/340 |
| 5,802,381 A | 9/1998 | Matsumoto ................. 395/779 |
| 5,814,803 A | 9/1998 | Olmstead et al. ........... 235/462 |
| 5,818,830 A | 10/1998 | Daane ........................ 370/347 |
| 5,819,173 A | 10/1998 | Lawrence et al. ........... 455/414 |
| 5,821,523 A | 10/1998 | Bunte et al. ................. 235/472 |
| 5,845,283 A | 12/1998 | Williams et al. ............ 707/101 |
| 5,845,303 A | 12/1998 | Templeman ................ 707/517 |
| 5,857,155 A | 1/1999 | Hill et al. ................... 455/456 |
| 5,862,345 A | 1/1999 | Okanoue et al. ....... 395/200.68 |
| 5,865,546 A | 2/1999 | Ganthier et al. ............ 400/489 |
| 5,909,581 A | 6/1999 | Park ........................... 395/712 |
| 5,911,044 A | 6/1999 | Lo et al. ..................... 395/200 |
| 5,918,159 A | 6/1999 | Fomukong et al. ........ 455/38.1 |
| 5,923,017 A * | 7/1999 | Bjorner et al. .............. 235/385 |
| 5,938,732 A | 8/1999 | Lim et al. .................... 709/229 |
| 5,951,639 A | 9/1999 | MacInnis .................... 709/217 |
| 5,983,115 A | 11/1999 | Mizikovsky ................ 455/512 |
| 5,997,168 A | 12/1999 | Harper et al. ............... 364/191 |
| 6,000,000 A | 12/1999 | Hawkins et al. ............ 707/201 |
| 6,002,918 A | 12/1999 | Heiman et al. ............ 455/38.3 |
| 6,009,274 A | 12/1999 | Fletcher et al. ............. 395/712 |
| 6,031,830 A | 2/2000 | Cowan ....................... 370/338 |
| 6,034,685 A | 3/2000 | Kuriyama et al. .......... 345/341 |
| 6,035,212 A | 3/2000 | Rostoker et al. ............ 455/552 |
| 6,042,012 A | 3/2000 | Olmstead et al. ...... 235/462.41 |
| 6,067,297 A | 5/2000 | Beach ........................ 370/389 |
| 6,073,851 A * | 6/2000 | Olmstead et al. ...... 235/462.45 |
| 6,076,099 A | 6/2000 | Chen et al. .................. 709/202 |
| 6,081,830 A | 6/2000 | Schindler .................... 709/204 |
| 6,101,505 A | 8/2000 | Sun ............................ 707/203 |
| 6,111,016 A | 8/2000 | Katayama et al. ........ 525/92 E |
| 6,122,409 A | 9/2000 | Boggs et al. ................ 382/276 |
| 6,128,483 A | 10/2000 | Doiron et al. ............... 455/419 |
| 6,128,661 A | 10/2000 | Flanagin et al. ............. 709/227 |
| 6,138,915 A | 10/2000 | Danielson et al. ..... 235/472.02 |
| 6,144,552 A | 11/2000 | Whitcher et al. ........... 361/681 |
| 6,164,545 A | 12/2000 | Danielson ................... 235/472 |
| 6,192,259 B1 | 2/2001 | Hayashi ..................... 455/575 |
| 6,208,812 B1 | 3/2001 | Sato et al. ................... 396/210 |
| 6,237,053 B1 | 5/2001 | Herrod et al. .............. 710/654 |
| 6,252,588 B1 | 6/2001 | Dawson ..................... 345/329 |
| 6,267,296 B1* | 7/2001 | Ooshima et al. ............ 235/487 |
| 6,311,895 B1 | 11/2001 | Olmstead et al. ...... 235/462.41 |
| 6,328,213 B1 | 12/2001 | He et al. ................. 235/462.25 |
| 6,340,114 B1 | 1/2002 | Correa et al. .......... 235/462.22 |
| 6,353,732 B1 | 3/2002 | Dvorak ..................... 455/67.3 |
| 6,377,982 B1 | 4/2002 | Rai et al. .................... 709/217 |
| 6,382,513 B1 | 5/2002 | Dvorkis et al. ........ 235/462.37 |
| 6,744,497 B1* | 6/2004 | Burns, Jr. ............. 356/139.09 |
| 2001/0041568 A1 | 11/2001 | Hughes et al. .............. 455/434 |

FOREIGN PATENT DOCUMENTS

| | | |
|---|---|---|
| EP | 0 837 406 A2 | 4/1998 |
| JP | 4 060 19811 A | 1/1994 |
| JP | 4 061 10873 A | 4/1994 |
| JP | 2002-024754 | 7/2000 |

OTHER PUBLICATIONS

Network Working Group, C. Perkins, Oct. 1996; http://rfc.sunsute.dk/rfc/rfc2002html.

U.S. Appl. No. 09/107,237, Joseph Cabana, et al., filed Jun. 30, 1998.

U.S. Appl. No. 09/684,514.

U.S. Appl. No. 09/686,123, Alex M. Garnert, et al., filed Oct. 10, 2000.

U.S. Appl. No. 09/880,906.

U.S. Appl. No. 10/118,562.

Visited the website at address http://www.PVS.com on Jul. 8, 2002.

* cited by examiner

BAR CODE READER INCLUDING LINEAR SENSOR ARRAY AND HYBRID CAMERA AND BAR CODE READER

REFERENCE TO RELATED APPLICATIONS

This application is a continuation-in-part which claims the benefit of priority to U.S. patent application Ser. No. 10/118,562, filed Apr. 9, 2002 and claims benefit of application 60/353,808, filed Oct. 26, 2001. This application is also related to U.S. patent application Ser. No. 09/880,906, filed Jun. 1, 2001. This application is also related to U.S. patent Ser. No. not yet assigned filed simultaneously herewith, entitled "Semiconductor Device Adapted For Imaging Bar Code Symbols" of Carlson et al.

BACKGROUND OF THE INVENTION

1. Field of the Invention

The present invention relates to imaging modules using solid state sensors for recording a target image, including optical code readers and digital cameras. Aspects of the invention are particularly useful in linear sensor-based and two-dimensional sensor-based, handheld bar code readers. More specifically, the present invention relates to reduced form factor modules which can be utilized in portable or mobile computers or consumer appliances.

2. Description of the Related Art

Optical codes are patterns made up of image areas having different light reflective or light absorptive properties, which are typically assembled in accordance with a priori rules. The term "bar code" is sometimes used to describe certain kinds of optical codes. The optical properties and patterns of optical codes are selected to distinguish them in appearance from the background. Devices for identifying or extracting data from optical codes are sometimes referred to as "optical code readers" of which bar code scanners are one type. Optical code readers are used in both fixed and portable installations in many diverse environments such as in stores for checkout services, in manufacturing locations for work flow and inventory control and in transport vehicles for tracking package handling. The optical code can be used as a rapid, generalized means of data entry, for example, by reading a target bar code from a printed listing of many bar codes. In some uses, the optical code reader is connected to a portable data processing device or a data collection and transmission device. Frequently, the optical code reader includes a handheld sensor which is manually directed at a target code.

Most conventional code readers are designed to read one-dimensional bar code symbols. The bar code is a pattern of variable-width rectangular bars separated by fixed or variable width spaces. The bars and spaces have different light reflecting characteristics. One example of a one-dimensional bar code is the UPC/EAN code.

Bar codes can be read employing solid state imaging devices. For example, an image sensor may be employed which has a two-dimensional array of cells or photo sensors which correspond to image elements or pixels in a field of view of the device. Such an image sensor may be a two-dimensional or area charge coupled device (CCD) and associated circuits for producing electronic signals corresponding to a two-dimensional array of pixel information for a field of view. A one-dimensional linear array of photodiodes may also be used in detecting a bar code reflection image (see, e.g., U.S. Pat. No. 6,138,915 to Danielson et al., which is herein expressly incorporated by reference).

It is known in the art to use a CCD image sensor and objective lens assembly in an optical code reader. In the past, such systems have employed complex objective lens assemblies originally designed for relatively expensive video imaging systems. Such systems may have a single sharp focus and a limited depth of field, which along with conventional aiming, illumination and signal processing and decoding algorithms, limits the versatility and working range of the system.

Other conventional imaging systems are designed primarily for reading optical codes. Such reading systems involve the assembly and alignment of several small parts. These parts may include a lens, an aperture and a 2D image sensor array such as a CCD chip. Such a structure is illustrated, for example, in U.S. patent application Ser. No. 09/096,578 for Imaging Engine and Method for Code Readers to Correa et al. filed Jun. 12, 1998 and assigned to Symbols Technologies, Inc, which is the same assignee as the present application. The '578 application is hereby incorporated by reference herein. A miniature imager adapted for use in a hand mounted code reader is also disclosed in U.S. patent application Ser. No. 09/684,514 filed Oct. 10, 2000 to Patel et al., which is also assigned to the same assignee as the present application, and is hereby incorporated by reference. Other systems are described at U.S. Pat. Nos. 5,814,803, 6,042,012, and 6,311,895 (describing a CMOS imager).

The design of an imaging system is dependent upon the size of the package in which the imaging system is to be manufactured. Conventional imaging systems which utilize off-the-shelf components are difficult to miniaturize due to the limited selection of off-the-shelf components. Further, due to various optical phenomena in the design of the system, various tradeoffs between a component size and the quality of a scanned image must be weighed in the selection of components. Additionally, the selection of certain components for an imager may, due to optical phenomena, limit the choice of other components for the miniature imager. It is therefore desired to have a miniaturized scanner with an optimal selection of components which provides an adequate scanned image, while minimizing the physical size and shape, i.e., the form factor, of the system.

To provide illumination and to assist in aiming, imaging systems can employ either lasers or light emitting diodes (LEDs). LEDs may be preferred over lasers since the incoherent nature of the LED light source does not produce the speckle noise impact that is produced by lasers. Further, LEDs are more cost effective than lasers due to the ease of manufacturing and packaging of LEDs. Additionally, LEDs can be built more compactly and are easier to surface mount than lasers. However, compared to lasers, LEDs are not an ideal point source. Specifically, light produced by an LED is less focused which produces an increased line thickness of the projected light. To reduce the line thickness of the light produced by an LED, many designers place a mechanical slit in front of the LED. However, the mechanical slit reduces the amount of light that is projected by the LED onto an object. Accordingly, it is desired to provide an LED-based aiming beam generation system that has a reduced line thickness of the projected light without severely reducing the amount of light projected by the LED.

In designing a digital image data capture device it is desirable, particularly in mobile products, to have the ability to capture a good quality digital photo and also read barcodes. To read barcodes with the same camera used for taking digital pictures typically results in neither system being optimized. Digital photos are better taken with a system focused at infinity with a relatively large aperture for collecting light. Barcode readers have better performance when the focus is pulled in typically between 4" to 8" from the principal plain. This has to do with maintaining the spatial sampling required for successfully decoding the barcode to be acquired. Although a large aperture is also desired for collecting light in barcode reading it is rarely acceptable due to the depth of field requirement typically referred to as the barcode reader's working range. The larger the aperture, the larger the optical blur circle and the quicker the image becomes out of focus as it is moved from the in focus position.

Several methods for solving these conflicting requirements have been previously proposed (see, e.g., U.S. Pat. Nos. 6,208,812, 5,821,523, 5,548,359, 5,530,498, and 5,525,788, which are hereby incorporated by reference). Some of these arrangements utilize moving optical elements to change the focus. The most common scheme is the auto-focus mechanism in a typical camera. More specific embodiments related to the field of barcode involve the sliding/moving of a piece of glass that ultimately changes the focus position of the optical system between two distinct settings. This moving of the piece of glass is much cheaper than a continuous auto-focus system but it still requires moving parts and the overhead of assembly complexity, reliability, and repeatability. These moving part schemes do have a distinct advantage in that they change the focus position for the entire field of view based on the desired image capture application (i.e., photo vs. barcode reading).

It has been shown that the retail and consumer marketplaces do not require the entire field of view to be changed between two focus positions. Retail and consumer applications for digital cameras, particularly in mobile devices, have the general demand for systems that take good quality digital pictures and read 1-D barcodes, and there is little demand for systems that read 2D barcodes in subsets of these market segments, particularly within the consumer market. By involving this related requirement of reading only 1-D barcodes well and taking good quality digital pictures, embodiments are provided herein that do not utilize moving parts, thus reducing cost and complexity, and improving reliability.

As mentioned, it is also desired to have bar code scanning equipment with extended depth of focus. U.S. Pat. No. 5,210,398, e.g., provides an advantageous system including a complex lens having multiple focal lengths. U.S. Pat. Nos. 5,640,001 and 6,138,915 describe scanners having focus control for operation over a range of distances. U.S. Pat. No. 5,814,803 describes several embodiments for extending the depth of focus including using gradient index lenses, staggered optical flats and primary collecting lenses followed by staggered secondary lenses, among others. U.S. Pat. No. 6,382,513 describes a system including a segmented collection mirror. Advantageous embodiments including simplified optics with fixed focus positions are provided herein below.

SUMMARY OF THE INVENTION

In view of the above, a semiconductor detector device for detecting optical code symbols is provided including no more than 512 pixels. Each of the pixels has an aspect ratio that is greater than 2 to 1 with a short dimension not greater than 8 microns. The pixels may be arranged in a single row and may have an aspect ratio that is greater than 4 to 1.

In a bar code reader, a sensor for detecting the field of view of the reader is provided including a single semiconductor device having a collection of surfaces configured as a set of preferably between 256 and 512 pixels. Each of the pixels has an aspect ratio that is greater than 2 to 1, with a short dimension not less than 2 microns and not greater than 8 microns. The aspect ratio may preferably be between 4 to 1 and 8 to 1.

A device for detecting images of arbitrary objects in a field of view and for reading coded indicia having parts of different light reflectivity located in the field of view is also provided. The device includes a single chip semiconductor sensor device. The device includes a first set of pixels and a second set of pixels. The first set has a first aspect ratio and is adapted for imaging arbitrary objects in the field of view thereon to produce a two-dimensional image to be recorded. The second set has a second aspect ratio greater than the first aspect ratio and is adapted for detecting at least a portion of light of variable intensity reflected of the coded indicia and for generating an electrical signal indicative of the detected light intensity.

In preferred embodiments the device includes a first lens having a first focal length and disposed over the sensor device for focusing an image on the first set of pixels, and a second lens having a second focal length and disposed over the sensor device for focusing an image on the second set of pixels. The device preferably includes signal processing means connected to the output of the second set of pixels of the sensor device for producing a digitized electrical signal indicative of a decoding of the electrical signal, and a decoder for processing the electrical signal into data represented by the coded indicia. The device also preferably includes image storage means connected to the output of the first set of pixels of the sensor device for storing digital signals indicative of a bit map representation of the image focused on the first set of pixels.

Also according to preferred embodiments, the device includes a lens assembly for imaging the arbitrary objects along a first optical path through a first geometric volume and for imaging the coded indicia along a second optical path through a second geometric volume separate from the first geometric volume. A lens assembly of the device may include a first portion for imaging the arbitrary objects and a second portion for imaging the coded indicia, wherein the first and second portions of the lens assembly are fixed in position relative to each other. A lens assembly may also preferably image the arbitrary objects and the coded indicia each from a same side of the device.

An optoelectronic module for use in a bar code reader is also provided including a frame, a single chip semiconductor sensor device supported on the frame, and an optical assembly mounted to the frame including a lens for focusing light on the sensor device.

The sensor device may preferably be mounted on a printed circuit board which is attached to the frame. One or more additional semiconductor chips may be mounted on the printed circuit board for processing signals received from the sensor device, e.g, including additional chips for storing electronic images and/or for decoding the signals.

The optical assembly may preferably include a rectangular aperture having a side approximately 1 mm or greater width. A visible light source is preferably provided for generating an aiming beam. A cylindrical/toroidal lens may be used for imaging the aiming beam. The lens may be formed as a one-piece assembly. The frame may include at least one notch for holding the device during assembly. The optical assembly may include a lens barrel that fits into a sleeve provided in the frame. A hole may be provided in the sleeve for affixing the lens barrel in place relative to the frame after the lens barrel is adjusted to substantially an optimum position relative to the sensor device.

INCORPORATION BY REFERENCE

What follows is a cite list of references each of which is, in addition to those references cited above and below, and including that which is described in the related art description, and the above invention summary, and the abstract, are hereby incorporated by reference into the detailed description of the preferred embodiment below, as disclosing alternative embodiments of elements or features of the preferred embodiments not otherwise set forth in detail below. A single one or a combination of two or more of these references may be consulted to obtain an advantageous variation of the preferred embodiments described in the detailed description below and within the scope of the present invention. Further patent, patent application and non-patent references are cited in the written description and are also incorporated by reference into the detailed description of the preferred embodiment with the same effect as just described with respect to the following references:

U.S. Pat. Nos. 6,382,513, 6,311,895, 6,208,812, 6,144,552, 6,138,915, 6,122,409, 6,053,408, 6,042,012, 5,821,523, 5,814,803, 5,640,001, 5,548,359, 5,530,498, 5,525,788, 5,467,164, and 5,210,398; and U.S. patent application Ser. Nos. 09/880,906, 09/096,578 and 09/684,514, which are assigned to the same assignee as the present application;

Web site of Photon Vision Systems (www.photo-vision.com); and

Japanese published application no. 2002-024754, filed Jul. 7, 2000.

DETAILED DESCRIPTION OF THE PREFERRED EMBODIMENTS

Bar Code Reader Module

Figure 1:
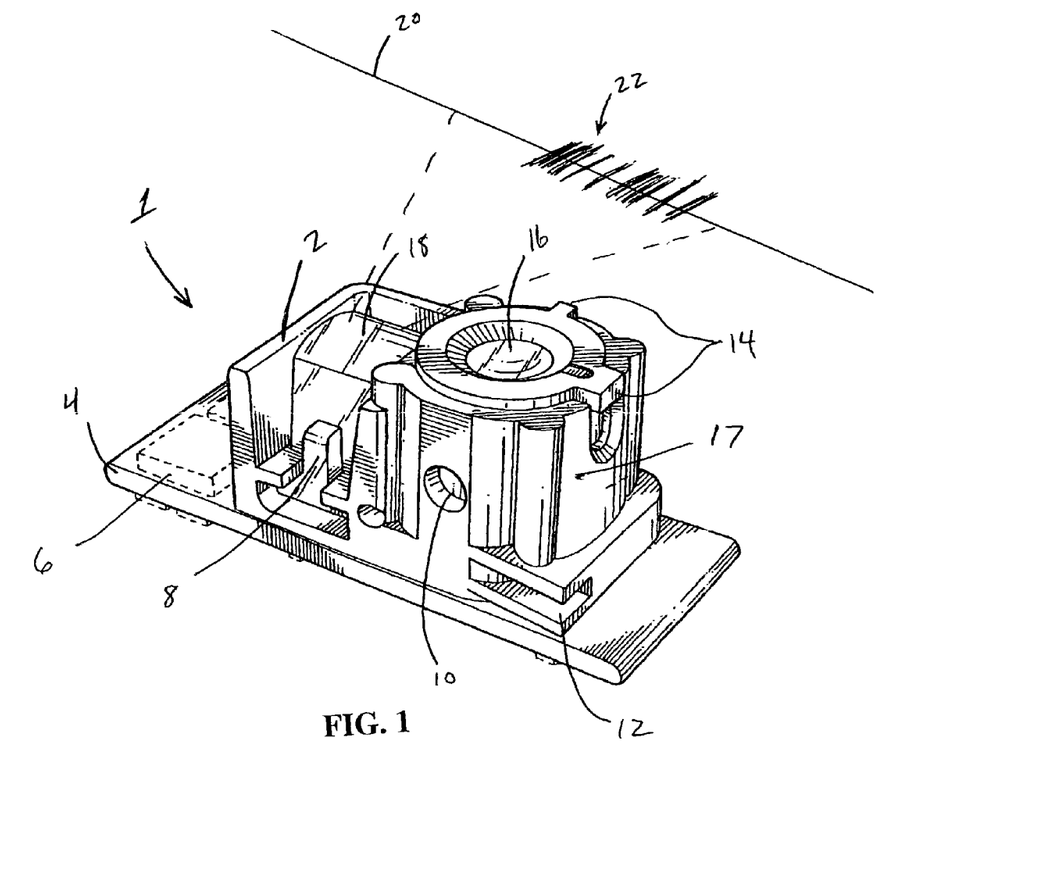
FIG. 1 schematically illustrates an optoelectronic module for use in a bar code reader in accordance with a preferred embodiment.

FIG. 1 schematically illustrates an optoelectronic module 1 for use in a bar code reader 1 in accordance with a preferred embodiment. The module 1 includes a frame 2 preferably made of plastic or other molded polymeric and/or synthetic material. A PC board 4 is coupled with the frame 2. Although not shown in FIG. 1 (see, e.g., FIG. 3), the PC board 4 has a semiconductor sensor device and a LED device mounted thereon (see also FIGS. 4A–4E). The semiconductor sensor device preferably includes a single CMOS chip having a linear array of pixels that are each elongated orthogonal to the linear direction of the array, i.e., parallel to the scan lines of a bar code symbol 22. The LED is preferably also elongated such that it is narrower in the focusing direction of lens 18, wherein lens 18 is preferably cylindrical/toroidal as being cylindrical on one side and toroidal on the other, and generally, lens 18 has greater optical power in the direction of the scan lines forming the bar code. The PC board 4 preferably includes other semiconductor chips 6 for processing signals received from the sensor device. For example, these other chips 6 may include a chip for storing electronic images and/or a chip for decoding the signals.

A lens 18, which is preferably cylindrical/toroidal, as mentioned, or at least having high power in the direction of the bar code stripes of the bar code symbol 22, is inserted into the frame 2 for focusing light emitted from the LED as a visible aiming beam 20 for the bar code reader 1. That is, when the aiming beam is aligned with the bar code symbol 22, as shown in FIG. 1, the bar code reader 1 is properly aligned for reading the bar code symbol 22. A molded plastic portion 8 of the lens 18 is used for aiding in the insertion of the lens 18 into the frame 2.

When the aiming beam 20 is aligned with the bar code symbol 22 as shown in FIG. 1, a focusing lens 16 images the bar code symbol onto the sensor device on the PC board 4. The focusing lens 16 is preferably formed into a lens barrel which fits into a cylindrical sleeve 17 in the frame 2. One or more notches 14, e.g., as shown in FIG. 1, may be used for positioning the lens barrel within the sleeve 17. The lens barrel including the focusing lens 16 is aligned relative to the sensor device, and is then fixed to the frame 2, e.g, using a glue hole 10, as shown in FIG. 1 or by other means understood by those skilled in the art such as a bolt or hook fastener assembly. A notch 12 is also shown in FIG. 1 that may be preferably used for holding the unit 1 in place during the assembly process.

The focusing lens 16 is itself preferably substantially a wide angle lens, e.g., 35°–40° for reading 1-D bar code symbols such as bar code symbol 22 illustrated schematically in FIG. 1. Therefore, a bar code symbol 22 that is substantially two inches from the lens 16, and out to substantially six inches from the lens 16, may be captured. For reading 1-D bar code symbols 22, the aperture for the lens 16 is preferably elliptical, and may alternatively be circular, square, rectangular or otherwise. The system preferably operates to capture the bar code images with no artificial illumination. The lens 16 is preferably spherical as capturing more light than an alternative cylindrical lens would. Illumination may alternatively be used with a spherical or cylindrical lens 16.

Figure 2A:
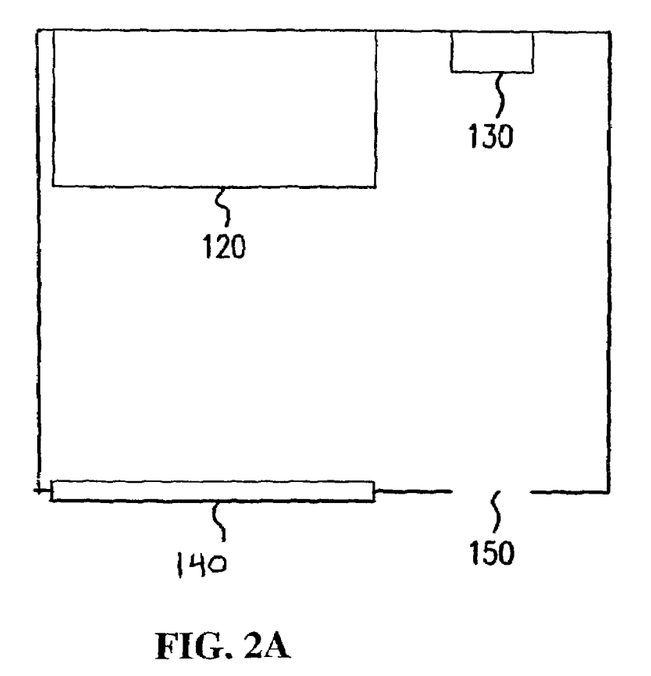
FIGS. 2A and 2B respectively schematically illustrate a top view and a side view of a miniature imager in accordance with an exemplary embodiment.
Figure 2B:
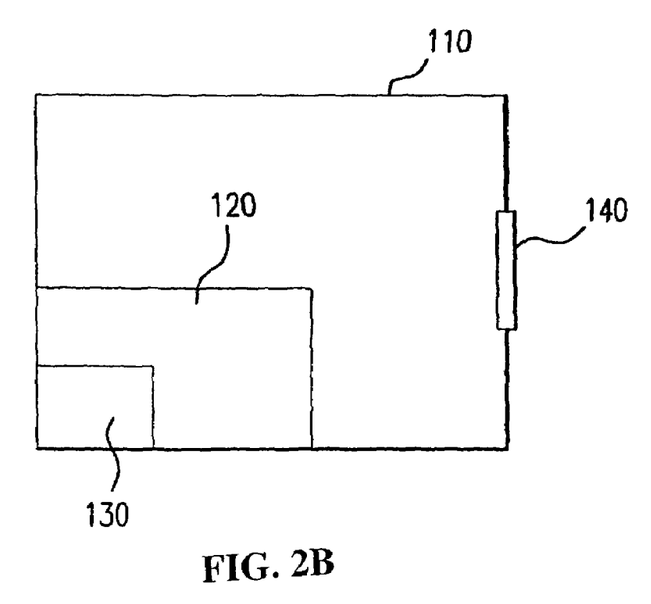

FIGS. 2A–2B respectively illustrate schematically in block form cross-sectional top and side views of a bar code reader in accordance with the preferred embodiment shown at FIG. 1. The bar code reader is incorporated into a molded optical package 110 corepsonding to the frame 2 of FIG. 1. Structures and techniques for so doing are disclosed in U.S. patent application Ser. No. 09/880,906, filed Jun. 15, 2001 to Mazz et al. entitled "Molded Imager Optical Package and Linear Detector-Based Scan Engines", which is assigned to the same assignee as the present application and is hereby incorporated by reference. The molded optical package includes an imaging/decoder integrated circuit (IC) 120 and imaging/focusing lens 140 corresponding to lens 16 of FIG. 1, and aiming light emitting diode or diodes (LED) 130 and aiming lens 150 corresponding to lens 18 of FIG. 1 (which are preferably not configured for broad illumination of bar code symbols, but may be alternatively configured to illuminate bar code symbols). In accordance with a preferred embodiment, the imaging/decoder IC 120 is fabricated in accordance with known complementary metal oxide semiconductor (CMOS) techniques. Alternatively, the imaging/decoder IC 120 can comprises a CCD imager with associated decoding circuitry.

In operation, the imaging/decoder IC 120 receives an image via imaging/focusing lens 140. To assist in aligning the target image (e.g., 1-D bar code symbol 22 of FIG. 1) to be focused by lens 140 to a sensor array of IC 120, an aiming beam is generated by focusing light emitted from LEDs 130 on the target image via aiming lens 150. The location of the target image in the proper field of view of the imaging/decoder IC is aided by projecting an aiming pattern on the target image using the aiming LED(s) 130. Illumination/aiming LEDs are focused on a target image through illumination/aiming lenses 150.

In accordance with a preferred embodiment, the volume of the imaging system is scaled by scaling the pixel pitch of the detector array of imaging/decoder IC 120. It will be recognized that the pixel pitch refers to the spacing between image elements, i.e., pixels, on an image sensor. When the pixel pitch is decreased the focal length is decreased to maintain a comparable field of view. If the aperture size is kept constant, then the same amount of light is collected per pixel and there is not a loss in imager sensitivity. If the size of the aperture is not limiting the size of the imager, then in a 2D imaging system all three dimensions scale by the scale factor of the pixel. In a 1D imaging system two dimensions scale by the scale factor of the pixel. The imaging engine of the preferred embodiment is designed to provide a similar depth of focus and similar light throughput for each pixel. This results in a balance with the pixel dynamic range and pixel quantum efficiency.

In a preferred embodiment, the bar code reader of FIGS. 2A–2B has a CMOS detector array 120 with an approximately 1–4 mm length of 256 to 512 pixels each having about a 5–8 micron width. This results in an advantageously small detector length. The focal length of the system is approximately 5 mm.

In the preferred 1-D system of the preferred embodiments, the detector footprint can be further minimized by making 2 or more rows of pixels offset, e.g., staggered, from one another. For example, an array of 500 pixels with 3 mm pitch has a length of 1.5 mm. By laying out the array as two adjacent rows offset by half of a pixel, the pixel pitch is maintained at 3 mm, but the detector array has a resultant length of 0.75 mm. Since the arrays are offset by half of a pixel, the pixel values can be combined to obtain a resolution equivalent to a 1.5 mm sensor. The pixel pitch is maintained at a reasonable level for absorbing photons, but the detector footprint, and thus, the total volume of the system can be dramatically decreased.

In accordance with exemplary embodiments, the imaging detector array, read-out electronics, analog-to-digital converter and decoding logic are all integrated into a single chip. The imaging/decoding chip is mounted on a carrier with at least one LED die or a small laser. The carrier can be an FR4 substrate, an industry recognized organic substrate, and may contain a lead frame or solder bumps for attachment to a larger circuit board. The carrier is covered with a molded plastic piece that has the optical surfaces molded into it. The molded plastic cover is optical quality and can tolerate temperatures encountered in automated circuit board assembly. The device may be configured as a complete scanner, including opto-mechanics and electronics, which could be handled like a surface mount integrated circuit and be compatible with re-flow soldering techniques. The device may be mechanically attached to a circuit board by solder joints only. Accordingly, screws or other mechanical supports would not be required, thus reducing the size and complexity of a device which incorporates this imaging engine.

Elongated Linear Pixel Array

Figure 3A:
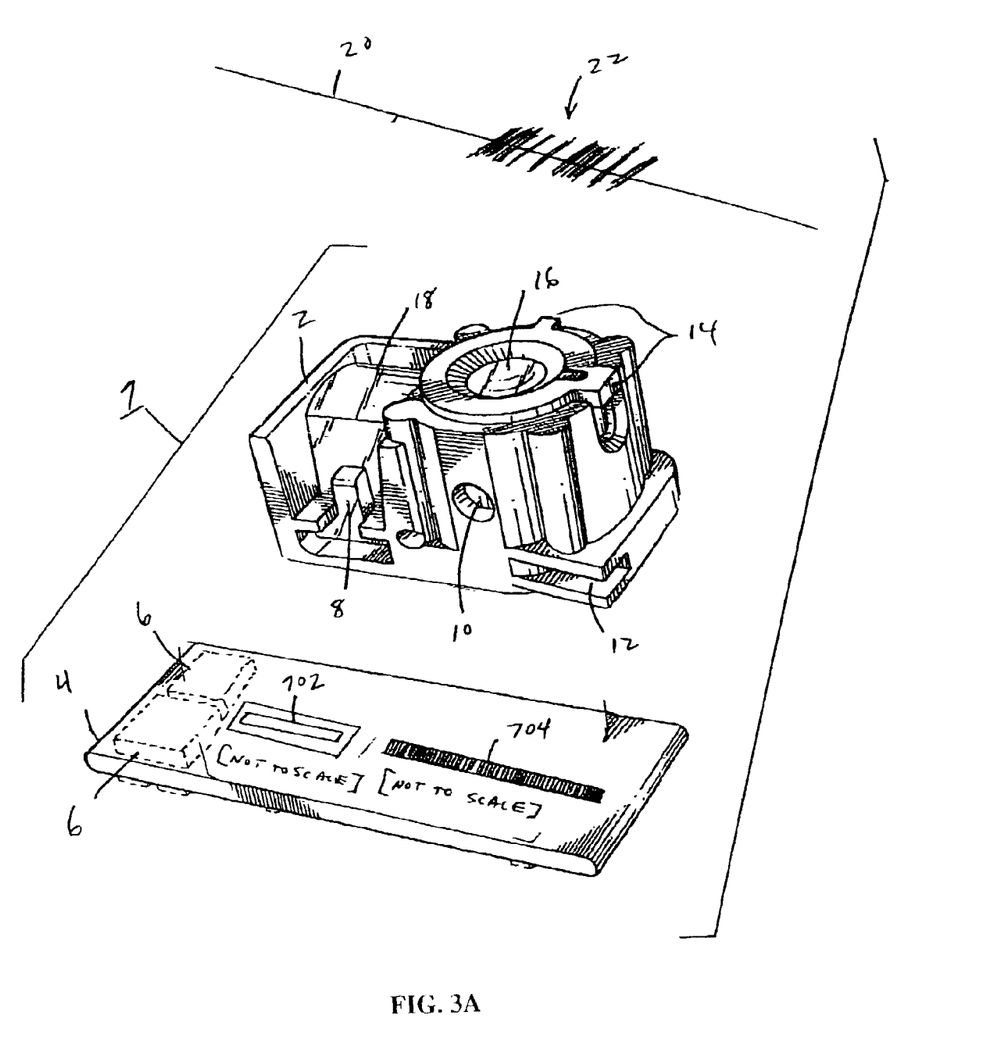
FIGS. 3A–3B are exploded schematic representations of a bar code reader in accordance with a preferred embodiment.

FIGS. 3A–3B are exploded schematic representations of a bar code reader 1 arranged in oriented depiction with a bar code symbol 22 in accordance with a preferred embodiment. Referring to FIG. 3A, the bar code reader 1 includes the frame 2 and PC board 4 of FIG. 1. The frame 2 is shown with cylindrical/toroidal lens 18 including molded plastic portion 8 inserted therein, sleeve 17 with lens barrel containing focusing lens 16 inserted therein, and notches 12 and 14 and glue hole 10, as described above with reference to FIG. 1. The PC board 4 is separated from the frame 2 in the exploded representation of FIG. 3A so that the LED 702 and sensor device 704 of the PC board 4 may be schematically illustrated. It is noted that the LED 702 and sensor device 704 are not drawn to scale in FIG. 3A (preferred dimensions are provided herein below). It is also noted that the orientation of the bar code reader 1 with respect to the bar code symbol 22 is that its elongated direction is perpendicular to the bar code stripes, as shown, and the proper orientation may be rotated, e.g., by 90°, with the orientations of the lenses 16, 18 and the LED 702 and sensor device 704 correspondingly rotated.

The LED 702 for emitting visible light focused by lens 18 to cross a bar code symbol 22 as an aiming beam 20 is shown next to the chips 6, which may be image storage and decoding chips 6. The LED 702 is preferably elongated with its narrow dimension in the focusing direction of the lens 18. The lens 18 preferably has higher power in the direction of the bar code stripes, is preferably cylindrical/toroidal, and may alternatively be purely a cylindrical lens, or may have some power in the orthogonal direction, e.g., such as to expand the aiming beam orthogonal to the bar code stripes and/or to direct the aiming beam somewhat to the right in FIG. 3A to compensate the LED 702/lens 18 portion of the bar code reader 1 being offset from the sensor device 704/focusing lens 16 portion of the bar code reader which is preferably centered on the bar code symbol 22 when an image is captured. The LED 702 is preferably a single, elongated LED device, as shown, and may alternatively include a single LED of arbitrary shape or multiple LEDs of arbitrary shape and location, with the condition that the LED 702/lens 18 combination produce a suitable aiming beam.

The sensor device 704 preferably includes a single semiconductor chip 704. This sensor device chip 704 preferably includes multiple sensor pixels arranged as a linear array, as shown in FIG. 3A. In a preferred embodiment, the device includes no more than 512 pixels, and preferably between 256 and 512 pixels. An arbitrary number of pixels may be used between a minimum number (e.g., 256) such that the pattern of the bar code symbol 22 is resolveable and a maximum number (e.g., 512) depending on size constraints due to the selected dimensions of the PC board 4 and the focusing properties of the selected lens 16. Although a single row is preferred, more than one row of pixels may be included. For example, two rows of pixels staggered by half their width may make up the sensor device 704 such that the resolution may be enhanced.

The pixels themselves are preferably elongated in the direction of the bar code stripes, as shown in FIG. 3A. The aspect ratio of the pixels is preferably greater than 2 to 1 and more particularly is between 4 to 1 and 8 to 1. The pixels preferably have a short dimension not less than 2 microns and not greater than 8 microns, and may specifically be between 7 microns and 8 microns. Thus the pixel array 704 is not drawn to scale with the frame 2 and PC board 4 in FIG. 3A. That is, for example, for 512 pixels each being 8 microns wide and, e.g., 64 microns tall, the sensor device 704 would have an effective area of about 4 mm×8 microns (which is substantially smaller than the relative dimensions of the sensor device 704 shown in FIG. 3 compared with the frame 2 and PC board 4). The advantageous elongated shapes of the preferred pixels provides an improved combination of high resolution of the 1-D bar code symbol 22 and high angular probability of capture of the bar code symbol image at the sensor device 704 compared with, e.g., a sensor device having a single row of square pixels.

Figure 3B:
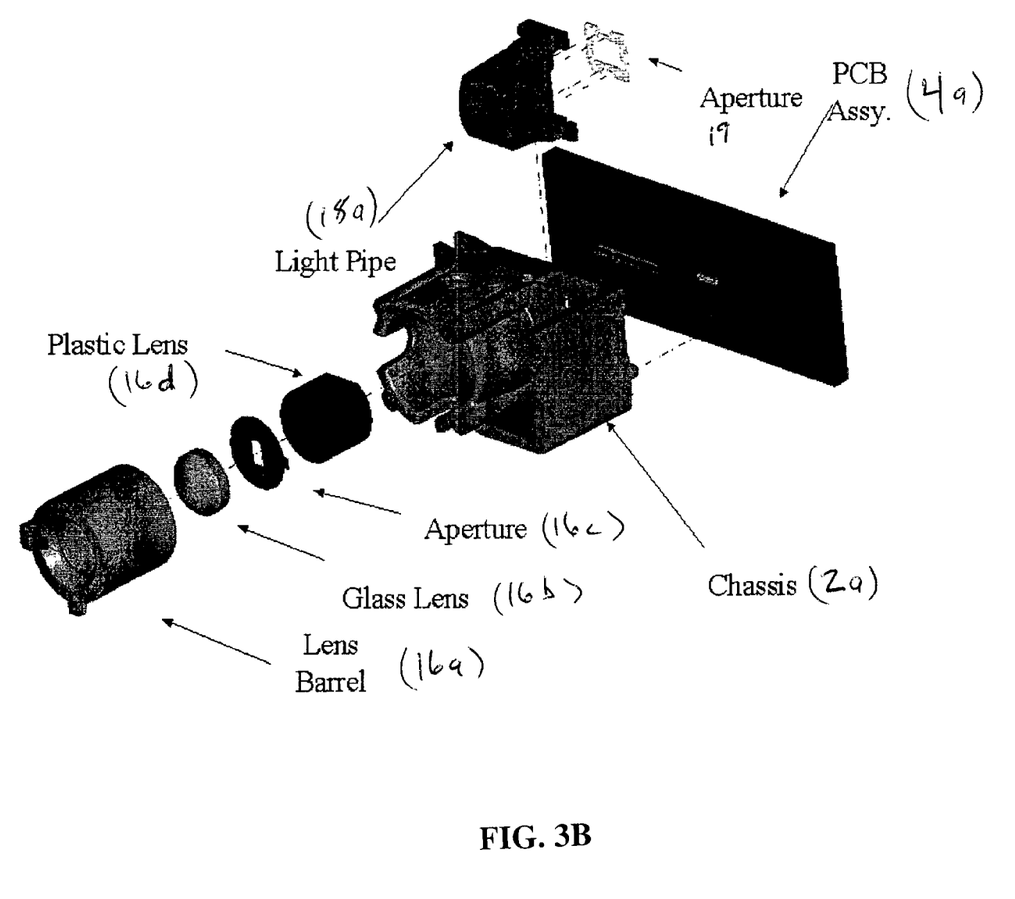

Referring now to FIG. 3B, elements of the frame 2 of FIG. 3A are also exploded from their mounted positions for perspective. A PCB assembly 4a is shown having preferred dimensions of 7.1 mm in height by 19.5 mm in width. A chassis 2a is shown removed from its mount to the PCB assembly 4a. The chassis 2a has preferred dimensions of approximately 6.6 mm by 11.45 mm. A lens barrel 16a is shown exploded from the slot in the chassis 2a so that features of the lens system can be shown. The lens system preferably includes a first lens 16b preferably made of glass, an aperture 16c and a second lens 16d preferably made of plastic. A light pipe 18a and aperture 19 are also shown removed from their mount to the apparatus in the exploded view of FIG. 3B.

Elongated Aiming Beam LEDS

FIGS. 4A–4D illustrate four different embodiments of elongated LEDs corresponding to LED 702 described above with reference to FIG. 3 in accordance with the preferred embodiment. Generally, the preferred LEDs of FIGS. 4A–4D, as well as the alternative LED 600 of FIG. 4E, each have a total die area which may be the same, i.e., having similar output power and having similar input power and total real estate requirements although they differ in shape and/or power input configuration. In particular, the preferred LED dies 615, 635, 655, 675 are thinned in the focusing direction of the lens 18 of FIG. 1, i.e., the direction which produces the line thickness of the aiming beam 20, and the dies 615, 635, 655, 675 are elongated in the direction perpendicular to the scan lines of the 1-D bar code symbol 22.

Figure 4A:
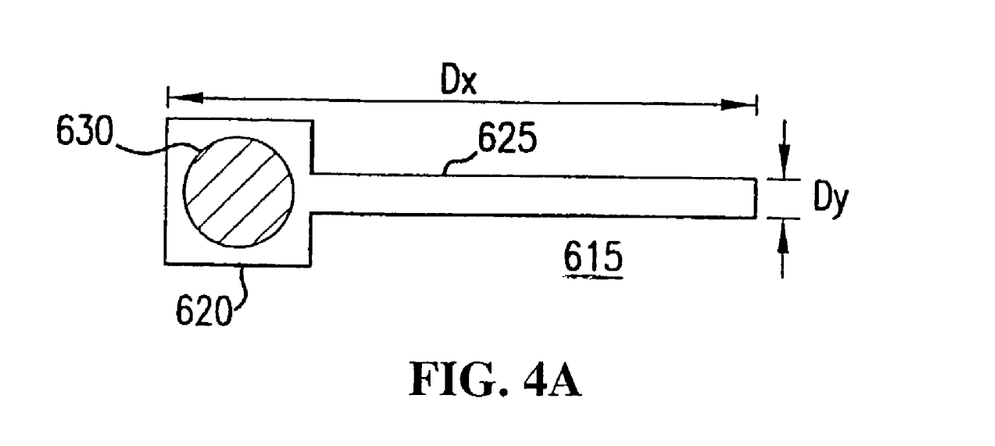
FIGS. 4A–4D schematically illustrate aiming beam LEDs in accordance with preferred embodiments.

Referring now to FIG. 4A, the LED 615 has a square portion 620 and a rectangular portion 625, the rectangular portion is the above-referred elongated portion. The square portion 620 has a bonding pad 630. Moreover, the LED 620 has dimensions of Dx by Dy, wherein Dy is the width of the elongated portion 625. Since the voltage which drives the LED is supplied via the bonding pad, the amount of light power emitting from the LED decreases the further the portion of the LED is from the bonding pad. Accordingly, in FIG. 4A, the amount of light power emitted from portions of the elongated portion 625 decreases for portions further to the right of the bonding pad 630. However, current LED technology provides sufficient luminescent intensity across the entire LED out to the right edge in FIG. 4A.

Figure 4B:
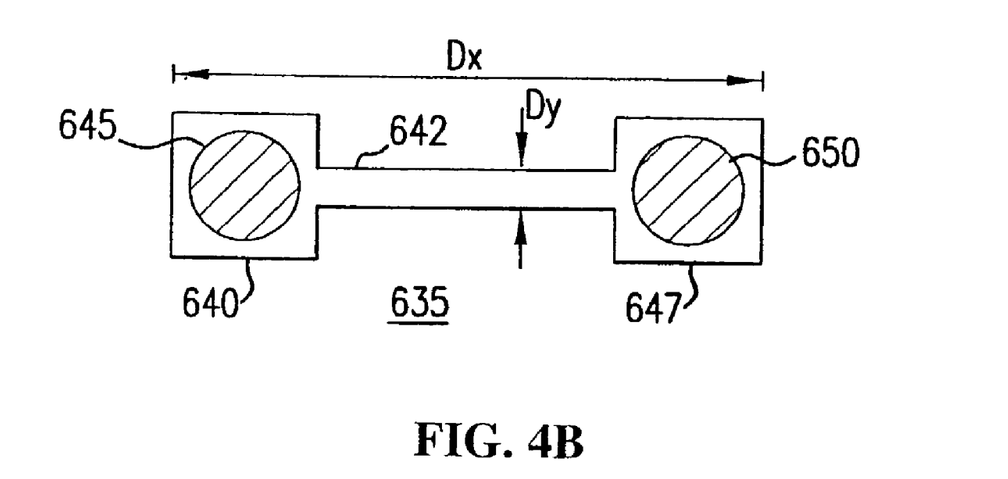

FIG. 4B illustrates a top view of an LED in accordance with another embodiment. Specifically, the LED 635 has two square portions 640 and 647 joined by a rectangular portion 642. Square portion 640 has bonding pad 645 located thereon and square portion 647 has bonding pad 650 located thereon. By placing bonding pads 645 and 650 on each side of the rectangular portion 642, a more uniform amount of light power emitted from the rectangular portion is achieved compared to the LED 615 illustrated in FIG. 4A.

Figure 4C:
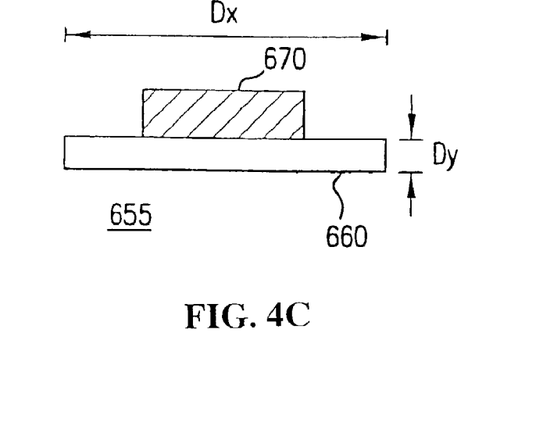

FIG. 4C illustrates a top view of an LED in accordance with yet another embodiment of the present invention. In accordance with this embodiment, a bonding pad 670 is placed adjacent to the rectangular portion 660 of LED 655. Accordingly, the bonding pad 670 does not block any light emitted from the elongated portion. Moreover, whereas the placement of the bonding pad in FIG. 4B may result in a reduced amount of light in the center of the rectangular portion, the placement of the bonding pad 670 in FIG. 4C ensures a more uniform distribution of light emitted from the center of the rectangular portion 660 of LED die 655.

Figure 4D:
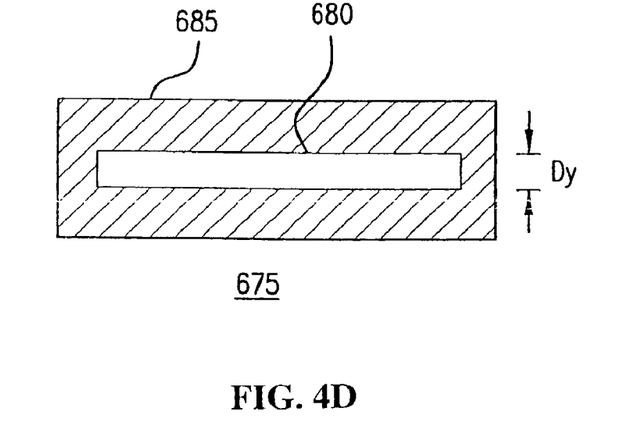

FIG. 4D illustrates a top view of an LED in accordance with a fourth embodiment. In accordance with this embodiment of the present invention, a rectangular portion 680 of the LED die 675 is surrounded on all sides by a bonding pad 685. By surrounding the rectangular portion 680 of the LED die 675 by the bonding pad 685, a uniform distribution of light emitted from the whole rectangular portion 680 of the LED die 675 is achieved compared to the LED dies illustrated in FIGS. 4A–4C.

In accordance with an exemplary embodiment, Dy in FIGS. 4A–4D may be reduced to less than or about 50 μm. To maintain sufficient emitting power, Dx, in FIGS. 4A–4D is advantageously selected, preferably around 1 mm, such that the total die area of the LED is such that sufficient emitting power is produced. In addition, the lens 18 of FIG. 1 is selected such that the aiming beam is focused to a thin, bright line for providing a sufficiently bright aiming beam 20, notwithstanding whether, if broadened, the beam would have sufficient power to illuminate the entire bar code symbol 22.

Figure 4E:
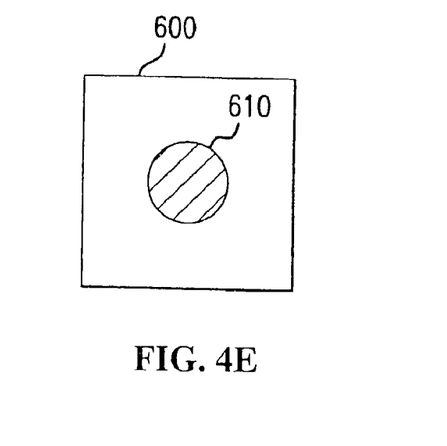
FIG. 4E schematically illustrates a square aiming beam LED in accordance with an exemplary alternative embodiment and illustrating advantages of the preferred embodiments of FIGS. 4A–4D.

FIG. 4E illustrates a top view of a square LED 600 such as may be used for generating a combined illumination/aiming beam, or even for providing only an aiming beam such as that mentioned above with reference to FIG. 1. For the reasons provided below, however, the LEDs 615, 635, 655 and 675 of FIGS. 4A–4D are preferred over the LED 600 of FIG. 4E. The LED 600 includes a bonding pad 610 through which electrical power is supplied to the LED 600. The LED 600 illustrated at FIG. 4E has a square shape and may have dimensions around approximately 300 μm by 300

μm. As illustrated in FIG. 4E, the bonding pad 610 may be typically placed in the middle of the LED 600. This placement of the bonding pad 610 blocks approximately 30% of the light power emitting from the LED 600. Moreover, as discussed above, the square LED of FIG. 4E produces less focused light than a laser, the result of which is projected light having an aspect ratio of 1:1 before being focused by lens 18.

The elongated LEDs 615, 635, 655 and 675 described above with reference to FIGS. 4A–4D, respectively, are preferred over the square LED 600 of FIG. 4E. This is because it is desired to have an aiming beam 20 that is focused to a narrow line that can be aimed to cross the entire bar code symbol 22, such as the highly linear aiming beam 20 illustrated at FIG. 1. Moreover, this aiming beam 20 is not otherwise needed to illuminate the bar code symbol 22 so that the reader 1 can capture it with sufficient intensity to resolve the scan lines. The aiming beam is preferably only used to align the reader 1, and thus a bright thin line is preferred over broad illumination, although the aiming beam may advantageously be used for both aiming and illumination. The advantageous LEDs 615, 635, 655 and 675 described above with reference to FIGS. 4A–4D, respectively, provide the desired bright, thin aiming beam 20, i.e., in conjunction with the lens 18 preferably having high power in the direction of the scan lines of the symbol 22 (e.g., the preferred lens 18 is a cylindrical/torioidal lens 18, as described above with reference to FIG. 1).

Bar Code Reader Electronics

Figure 5:
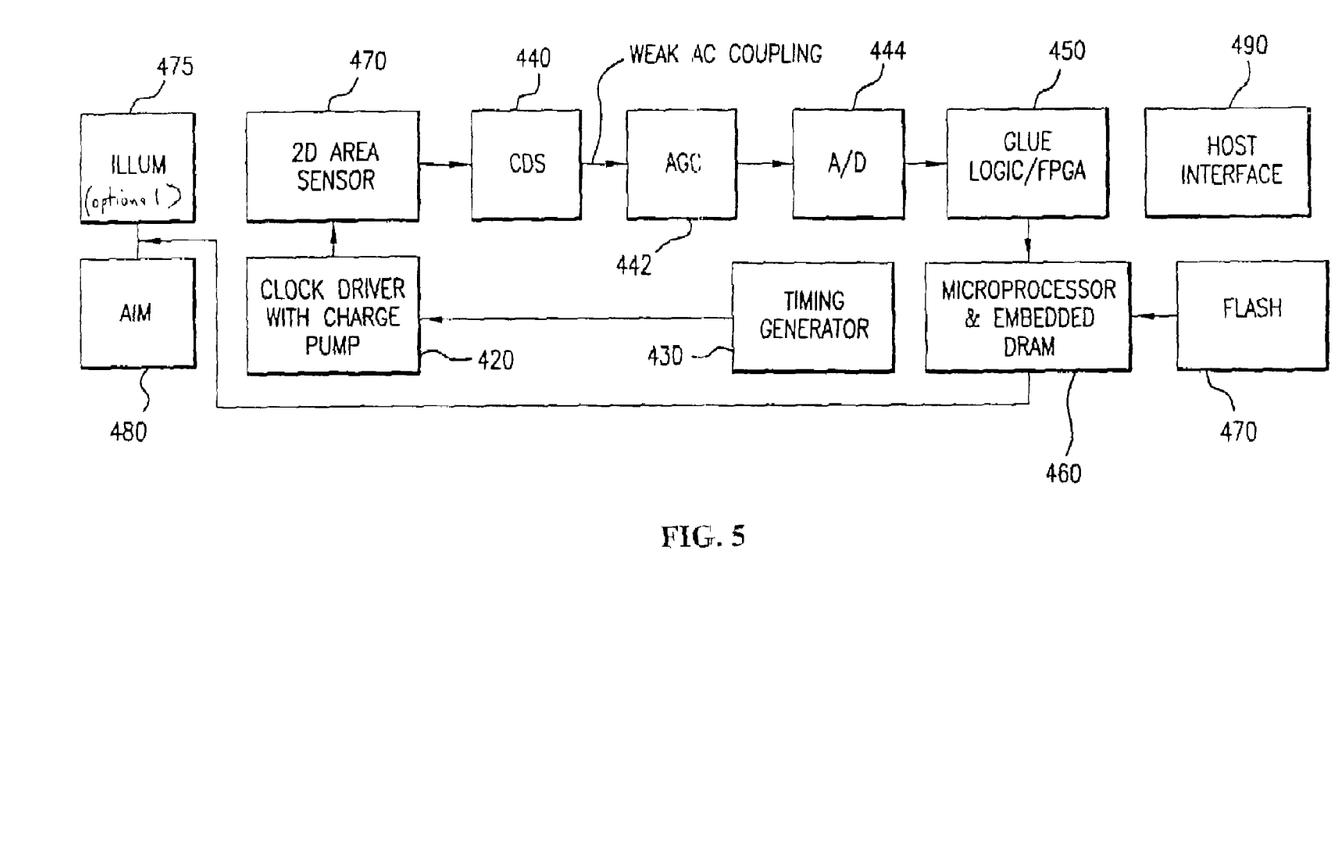
FIG. 5 schematically illustrates preferred electrical components of a bar code reader in accordance with a preferred embodiment.

FIG. 5 illustrates the electronics of a bar code reader in accordance with a preferred embodiment. These electronics include a sensor device 410 which is controlled via clock driver and charge pump 420. Clock driver and charge pump 420 is controlled in accordance with signals received from timing generator 430. An image captured by sensor device 410 is provided to correlated double sampling block 440. Since pixels do not always return to the same value when they are reset, correlated double sampling is used to remove the offset introduced by pixels which have not returned to their normal reset values. Accordingly, correlated double sampling involves capturing two values of the pixels, the first value is the value of the pixels with the desired image, e.g., a 1-D bar code, and the second value is the value of the pixels after being reset. The two values of each pixel are compared to remove the offset introduced by pixels which have not returned to their normal reset value. After performing the correlated double sampling, the image is passed through a weak AC coupling to block DC content of the correlated double sampled image. After the weak AC coupling, an automatic gain control 442 amplifies the signal which is then provided to an analog-to-digital converter 444. In accordance with a preferred embodiment of the present invention, the analog-to-digital converter is a 9 bit analog-to-digital converter.

Digital data is provided by the analog-to-digital converter to the glue logic field programmable gate array (FPGA) block 450. The glue logic/FPGA 450 packs the digital data so that it can be read by microprocessor 460 and connects with the microprocessor 460 to provide all of the device controls. The microprocessor 460 includes DRAM embedded on the same IC as the microprocessor which increases the speed of the system while allowing a reduced size and cost for the resultant imager. The microprocessor 460 operates under control of a program stored in flash memory 470 via an external data and address bus.

The target image, e.g., such as 1-D bar code symbol 22 of FIG. 1, is preferably sufficiently illuminated by ambient light due to the optoelectronic configuration of the preferred bar code reader 1 of FIG. 1, so that the bar code symbol 22 is resolvable without additional illumination. However, in an alternative embodiment, illumination may be provided by one or more 650 nm red LEDs of an optional illumination module 475. The LEDs would be arranged so that the target image is uniformly illuminated.

To assist a user of the reader 1, the preferred aiming module 480 is preferably used to provide a unique aiming pattern. Aiming module 480 can include an elongated LED (see FIGS. 3 and 4A–4E) and lens 18 of FIGS. 1 and 3, or alternatively may include a laser diode and a diffractive optical element (DOE) to provide the unique aiming pattern. Interaction between a host device which may incorporate the preferred bar code reader 1 of FIG. 1 may be provided using host interface 490 of FIG. 5. Since the preferred bar code reader 1 described herein is miniature, i.e., of a small form factor, a host device may be a portable radio telephone (cellular phone), a personal digital assistant (PDA), or the like. Using the elements described in connection with FIG. 5, miniature bar code reader device can be achieved which can be manufactured in a SE900 or smaller form factor which may be used in the imager industry for the manufacture of imaging devices.

Extended Depth of Focus, First Embodiment

Figure 6:
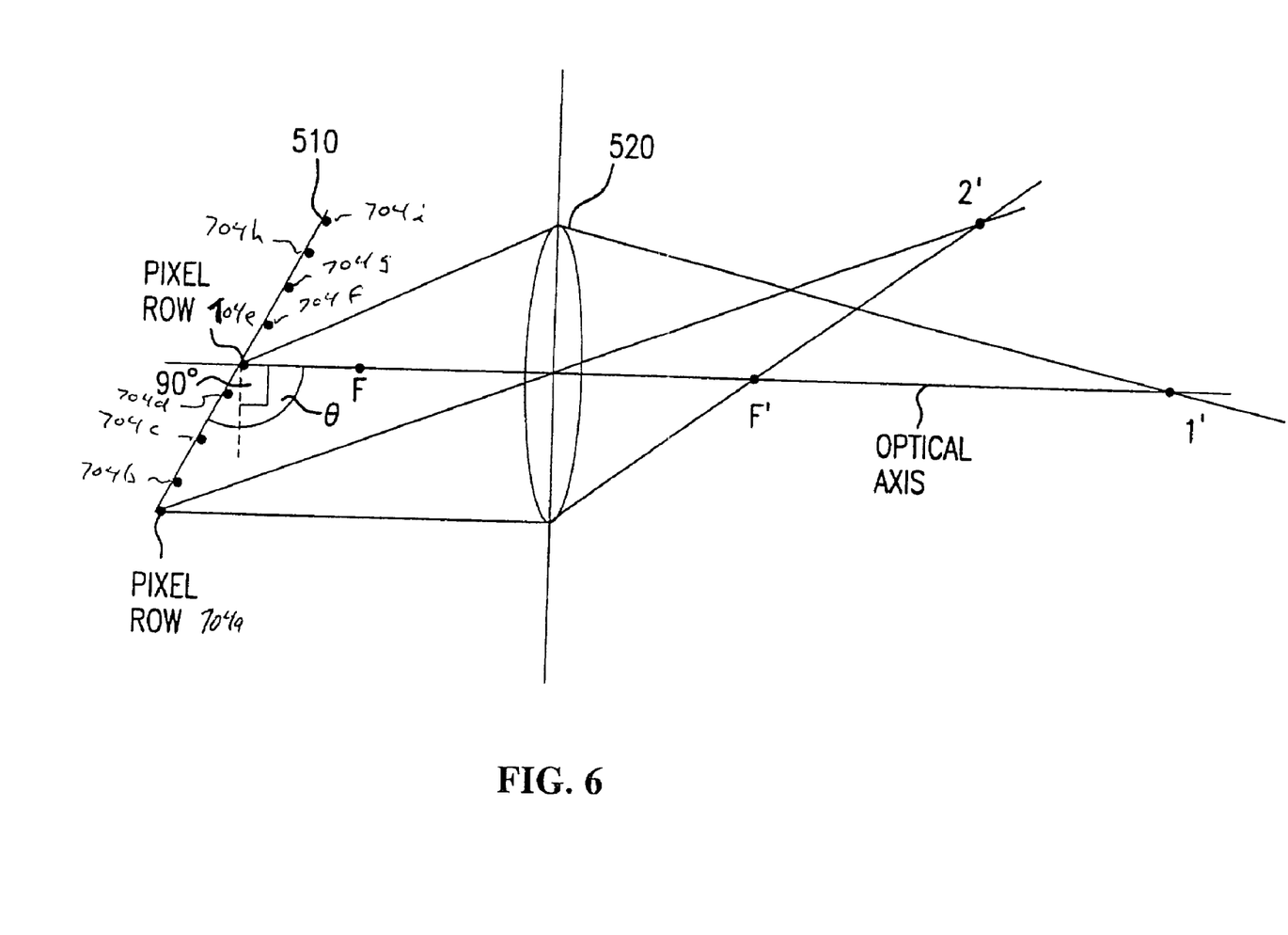
FIG. 6 illustrates an arrangement for increasing the working range of a bar code reader.

In accordance with an alternative embodiment, the working range of the bar code reader device 1 may be increased by provided multiple linear rows 704a–704i, each being preferably the same as the preferred linear array 704 described above with reference to FIG. 3, and positioning the rows 704a–704i as a plane of the image sensor 510 at an angle which is not perpendicular to the optical axis of the focusing lens. FIG. 6 illustrates how a bar code reader can operate with an increased working range. Specifically, an image sensor 510 and a focusing lens 520 are relatively oriented as shown schematically at FIG. 6. The image sensor 510 comprises a plurality of horizontal rows of pixels 704a–704i facing the lens 520. As mentioned, each row of pixels is preferably the same as or similar to the preferred single linear array 704 described above with reference to FIG. 3. Although not illustrated in FIG. 6, it will be recognized that the device illustrated therein may have additional components similar to those discussed elsewhere herein with reference to FIGS. 1–5, 8 and 9A–9C.

As illustrated in FIG. 6, a plane parallel to the front of the pixels of imager 510 is tilted at an angle θ with respect to the optical axis of focusing lens 520. Accordingly, horizontal pixel row 704a of the imager 510 is focused at spatial plane 1' and horizontal pixel row 704e is focused at spatial plane 2'. By placing the image sensors of imager 510 at a non-perpendicular angle θ with respect to the optical axis of the focusing lens 520, the device is able to read and decode target images which are at various distances from the imager by interrogating each of the horizontal rows of pixels 704a–704i which are focused at different spatial planes. The ability to read and decode target images which are at various distances reduces user frustration from having to manually adjust the distance between the imager and the target image to successfully read and decode the target image. Another embodiment which allows a bar code symbol 22 to be read from more than one range of distances is provided with reference to FIGS. 7–8. The device illustrated in FIG. 6 is preferably used for reading 1-D barcodes, and can also be used for reading two dimensional bar codes, in either a manual or automatic mode. In addition, the electronics described below with reference to FIG. 8 may be used, wherein the multiple rows 704a–704i of FIG. 6 are substituted for the multiple sensors 952, 954, etc. of FIG. 8.

Extended Depth of Focus, Second Embodiment

Figure 7:
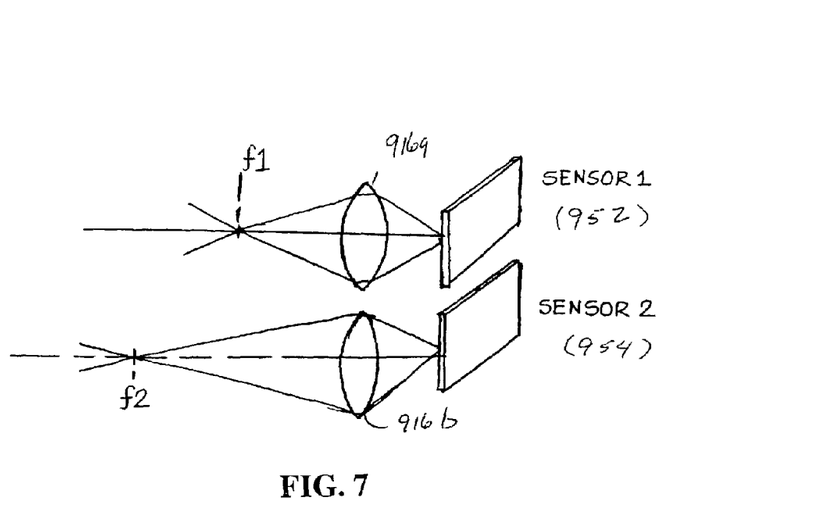
FIG. 7 schematically illustrates a bar code reader according to an alternative embodiment including multiple optical paths for focusing bar code images from various distances from the bar code reader optics.

FIG. 7 schematically illustrates a dual linear image scanner or 1-D bar code reader according to an alternative embodiment including multiple optical paths for focusing bar code images from various distances from the bar code reader optics. Either of the 1-D bar code reader system 1 of FIGS. 1 and 3 or the hybrid system 800 of FIG. 9A (see below) may be modified to include the features of FIG. 7. Generally, a pair of lenses 916a and 916b are used, wherein each of the lenses 916a and 916b is the same or similar to the lens 16 of FIG. 1, except that each has a different working range for resolving 1-D bar code symbols on their respective sensors 920a and 920b. Using the multiplexer electronics described below with reference to FIG. 8, each sensor is sampled for a resolvable bar code symbol, thus enhancing the effective working range of the overall system over a system including only one lens 16. As with the hybrid system of FIG. 9A, the individual 1-D bar code reader feature of the system of FIG. 7 is preferably the same as that described above with reference to FIGS. 1–5, and so the details are repeated here.

Figure 8:
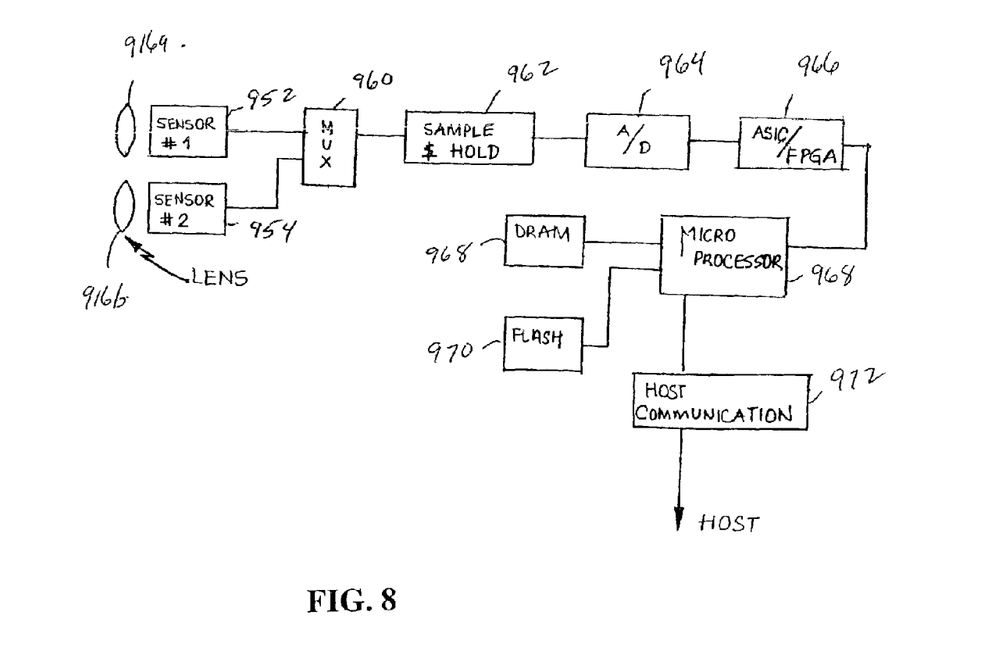
FIG. 8 is a block diagram of the alternative bar code reader of FIG. 7 including associated electronic components.

FIG. 8 is a block diagram of the alternative bar code reader of FIG. 7 including associated electronic components. The data from both of the sensors 952 and 954 is preferably processed using common decode logic. The sensors 952 and 954 receive optical signals through their respective lenses 916a and 916b. Sensor input feeds through a multiplexer 960, through a sample and hold circuit 962, an analog to digital converter 964, an ASIC/FPGA 966, and a microprocessor 968. The data may be stored in DRAM 968 and/or flash memory 970. The data may also be sent to a host system processor via a host communication interface 972.

The signals from the sensors 952 and 954 are preferably alternately sampled and for analyzing the data from both of the sensors 952 and 954. Preferably both paths are configured to be aligned when the aiming beam in positioned to cross all of the scan lines of a bar code symbol. Similar multiplexer electronics may be used with the multiple linear rows of different distances described above with reference to FIG. 6.

Hybrid Camera and Bar Code Reader

Figure 9A:
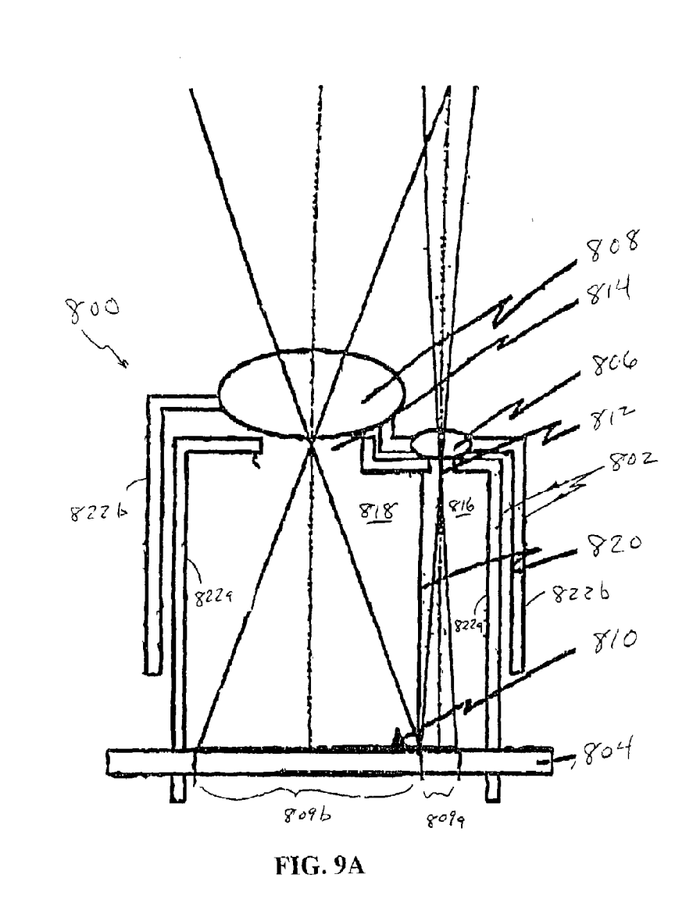
FIG. 9A schematically illustrates a cross-sectional side view of a hybrid camera/bar code reader in accordance with a preferred embodiment.
Figure 9B:
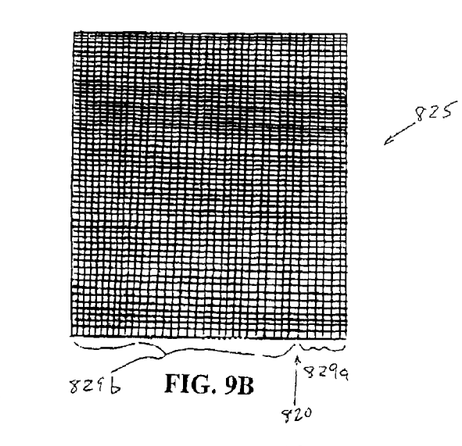
FIGS. 9B–9C schematically illustrate alternative embodiments of a sensor device for the hybrid camera/bar code reader of FIG. 9A.
Figure 9C:
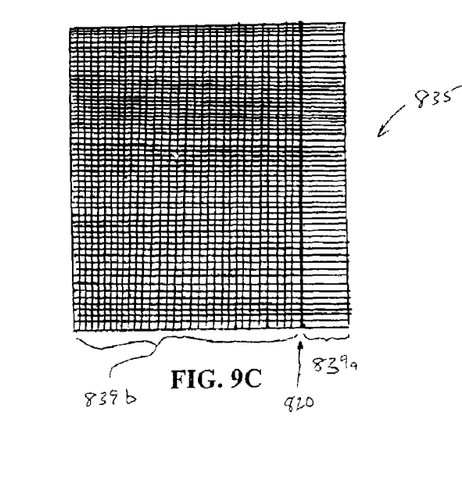

FIGS. 9A–9C schematically illustrates a hybrid picture/video camera and 1-D barcode reader, or hybrid system 800, according to a preferred embodiment. Referring to FIG. 9A, the preferred hybrid system 800 advantageously provides optimized 1-D barcode reading and 2-D digital image capture. A housing 802 encloses the interior components of the system 800 and holds the optics in place relative to the electronics. A PC board 804 is mounted to the housing 802, similar to the way the PC board 4 of FIGS. 1 and 3 is mounted to the frame 2. In this sense, the housing 802 may include the same frame 2 of FIG. 1 modified (i.e., expanded) to include the 2D image capture components of the hybrid system of FIG. 9A. Thus, the above description with reference to FIGS. 1–8 is incorporated here and not repeated with respect to details of the 1-D barcode reader aspect of the hybrid system of FIG. 9A. For example, components (e.g., LED 702 and lens 18) for providing an aiming beam 20 are preferably included in the hybrid system 800, although they are not shown in FIG. 9A.

The hybrid system 800 preferably includes a first lens 806 for barcode reading and second lens 808 for image capture or standard picture taking, as shown. The first lens 806 and the second lens 808 have different focal lengths and are generally configured differently according to their respective functions of capturing 1-D bar codes symbols and arbitrary images. As shown in FIG. 9A, the first lens 806 having a first focal length is disposed over a first portion 809a of the overall sensor device 810 which will be described in more detail below with reference to FIGS. 9B–9C. That is, the first lens 806 focuses a bar code image onto the first set of pixels 809a. The second lens 808 having a second focal length is disposed over a second portion 809b of the overall sensor device 810, such that the second lens 808 focuses an arbitrary image onto the second set of pixels 809b.

Alternatively, a single lens element could be used. The alternatively single lens element would have a bi-focal type structure including a first portion having the first focal length for focusing 1-D bar code images onto the first set of pixels 809a and a second portion having the second focal length for focusing arbitrary images onto the second set of pixels 809b of the sensor device 810.

The aperture 812 for the first lens 806 for focusing the 1-D bar code images is preferably shaped according to the rectangular shape of the 1-D bar code images. For example, the aperture 812 is preferably elliptically-shaped and may be rectangularly-shaped. The aperture 814 for the second lens 808 for focusing the arbitrary images is preferably shaped according to the arbitrary shapes to be captured. For example, the aperture 814 is preferably circularly-shaped or otherwise depending on the film to be exposed with the camera.

The preferred hybrid system 800 therefore includes a lens assembly for imaging the coded indicia or 1-D bar code objects along a first optical path through a first geometric volume 816 and for imaging the arbitrary objects along a second optical path through a second geometric volume 818 separate from the first geometric volume 816. In this way, the lens assembly of the hybrid system may include the first lens 806 for imaging the coded indicia and the second lens 808 for imaging the arbitrary images, wherein the first and second lenses 806 and 808, respectively, of the lens assembly may be fixed in position relative to each other and preferably also to the housing 802. The hybrid system 800 according to a preferred embodiment also advantageously provides the convenience that the arbitrary objects and the coded indicia or 1-D bar code objects are each captured from a same side of the device 800. This provides the advantage that the system 800 need only be configured for handling from a single orientation for both for taking pictures and for capturing coded indicia or 1-D bar code symbols. Manufacture is also simplified because the two systems can be assembled from a same orientation.

The hybrid system 800 may include an optical baffle 820 dividing the image sensor 810 into the two regions 809a and 809b, as well as separating the geometric volumes 816 and 818. For example, the housing 802 may include both a camera housing 822a and a lens holder 822b. The camera housing couples to the PC Board 804 and includes the apertures 812 and 814 and optionally the baffle 820. Sliding over the camera housing 822a is the lens holder 822b containing the two sets of optical systems 806 and 808. The optical arrangement whose field-of-view (FOV) covers the first set of pixels 809a is optimized in terms of focal length, focus position, aperture shape, and F# for 1D bar code reading. The second optical arrangement whose FOV covers the second set of pixels 809b is optimized in terms of focal length, focus position, aperture shape and F# for digital picture taking.

Sensor Devices for the Hybrid System

FIGS. 9B–9C schematically illustrate sensor devices 825 and 835, respectively, corresponding to sensor device 810 of the hybrid system 800 of FIG. 9A for detecting images of arbitrary objects in a field of view and for reading coded indicia or 1-D bar code symbols having parts of different light reflectivity located in the field of view. The sensor devices 825 and 835 each preferably include single chip semiconductor sensor devices.

Referring to FIG. 9B, the sensor device 825 includes a first set of pixels 829a and a second set of pixels 829b corresponding to the first and second sets of pixels 809a and 809b, respectively of FIG. 9A. The sensor device 825 according to a first embodiment includes a VGA resolution sensor, e.g., a 640 pixel by 480 pixel image sensor. The optical baffle 820 may be used to divide the sensor 825 into the first and second regions 816 and 818, respectively, described above with reference to FIG. 9A. The first set of pixels 829a may include, e.g, 640 pixels by 15 rows of pixels, while the second set of pixels may includes 640 pixels by 465 rows of pixels. This method in effect "steals" 15 rows of pixels 829a from the VGA sensor and uses them for barcode reading while the balance of the array 829b (the other ~97%) is used for picture taking or video applications. This scheme makes use of only a single sensor array and no moving parts to provide a 1-D barcode reader and a low-cost good quality image capture device in a single hybrid system 800.

Referring now to FIG. 9C, the sensor device 835 includes a first set of pixels 839a having a first aspect ratio, i.e., preferably between 4 to 1 and 8 to 1, adapted for detecting 1-D bar code symbols such as the linear array 704 described above with reference to FIG. 3. The second set 839b has a second aspect ratio, preferably 1 to 1, for detecting arbitrary objects in the field of view thereon to produce a two-dimensional image to be recorded. The first and second sets of pixels 839a and 839b, respectively, may be a specially manufactured single sensor array with the pixels 839a and 839b manufactured with the different aspect ratios.

Alternatively with reference to each of FIGS. 9B and 9C, the devices 825 and 835 may include the first set of pixels 829a and 839a, respectively, and the second set of pixels 829b and 839b, as separate arrays. For example, with reference to FIG. 9B, the array 829a may include a separate 640 pixel by 15 pixel array, while the array 829b may include a standard array of 640 pixels by 480 pixels. With respect to FIG. 9C, the first array 839a may be the same advantageous linear array of elongated pixels as described above with reference to FIG. 3, while the second array 839b may be a standard 2-D array of square pixels, e.g., 640 pixels by 480 pixels.

This alternative approach is a more brute force approach wherein two sensors are employed. The VGA or CIF sensor 829b, 839b for photo/video capture and a separate 1D array 829a, 839a for reading 1D barcodes. Software algorithms that can decode the output of this sensor may use 2 Kbytes of RAM and less than 48 Kbytes of ROM. The microprocessor used to process the digital image can also easily handle the 1D bar code reading requirements. Therefore, this alternative approach makes use of low-cost 1D CMOS sensors that can have space, reliability, and cost advantages over a more bulky moving optics system. Again, two lens systems 806 and 808 are used each optimized for their own task. In this embodiment, the 640×15 pixel area of the first embodiment with reference to FIG. 9B is replaced by a separate sensor. There are at least two distinct benefits to this alternative arrangement. First, the entire 2D sensor can be used for image capture. Second, the 1D sensor's pixel shape and exposure scheme is optimized for barcode reading making it much more sensitive to light and better performing on poor quality bar codes.

Although not specifically shown in FIG. 9A, the hybrid system 800 preferably includes signal processing means connected to the output of the second set of pixels 809b, 829b, 839b of the sensor device 810 for producing a digitized electrical signal indicative of a decoding of the electrical signal, and a decoder for processing the electrical signal into data represented by the coded indicia. The device also preferably includes image storage means connected to the output of the first set of pixels 809a, 829a, 839a of the sensor device for storing digital signals indicative of a bit map representation of the image focused on the first set of pixels.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and structural and functional equivalents thereof.

What is claimed is:

1. A solid-state imaging array for electro-optically reading a one-dimensional symbol and for imaging a target, comprising:
   a) a two-dimensional subarray of first pixels extending along mutually orthogonal directions, for detecting light from a target and generating electrical signals indicative of a two-dimensional image of the target, each first pixel having a first aspect ratio;
   b) a linear subarray of second pixels extending along one of said directions, for detecting light from a one-dimensional symbol and generating electrical signals indicative of the one-dimensional symbol, each second pixel having a second aspect ratio greater than said first aspect ratio; and
   c) a single semiconductor chip on which both subarrays are provided.

2. The array of claim 1, wherein the first aspect ratio is 1:1.

3. The array of claim 1, wherein the second aspect ratio is in a range from 4:1 to 8:1.

4. The array of claim 1, wherein the first pixels of the two-dimensional subarray are arranged in mutually orthogonal rows and columns, and wherein the second pixels of the linear subarray are arranged along one of the rows.

5. The array of claim 4, wherein each row has a number of pixels in a range from 256 to 512 pixels.

6. The array of claim 4, wherein each pixel has a dimension in a range from 2 to 8 microns.

* * * * *